United States Patent
Camillo-Castillo et al.

(10) Patent No.: US 8,586,423 B2
(45) Date of Patent: Nov. 19, 2013

(54) SILICON CONTROLLED RECTIFIER WITH STRESS-ENHANCED ADJUSTABLE TRIGGER VOLTAGE

(75) Inventors: Renata Camillo-Castillo, Essex Junction, VT (US); Erik M. Dahlstrom, Burlington, VT (US); Robert J. Gauthier, Jr., Hinesburg, VT (US); Ephrem G. Gebreselasie, South Burlington, VT (US); Richard A. Phelps, Colchester, VT (US); Yun Shi, South Burlington, VT (US); Andreas Stricker, Milpitas, CA (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 13/168,232

(22) Filed: Jun. 24, 2011

(65) Prior Publication Data

US 2012/0326766 A1    Dec. 27, 2012

(51) Int. Cl.
    *H01L 21/02* (2006.01)
(52) U.S. Cl.
    USPC ........... 438/133; 438/135; 438/303; 438/305; 438/309; 257/E21.389; 257/E29.215; 257/E29.225
(58) Field of Classification Search
    USPC .......... 438/133–135, 305–309; 257/E21.389, 257/29.215–225
    See application file for complete search history.

(56) References Cited

U.S. PATENT DOCUMENTS

| | | | |
|---|---|---|---|
| 3,947,864 A | 3/1976 | Yatsuo et al. | |
| 5,574,297 A | 11/1996 | Sennenbara et al. | |
| 5,856,214 A | 1/1999 | Yu | |
| 6,610,262 B1 | 8/2003 | Peng et al. | |
| 6,759,691 B2 | 7/2004 | Chen | |
| 7,202,114 B2 | 4/2007 | Salcedo et al. | |
| 7,274,047 B2* | 9/2007 | Russ et al. | 257/133 |
| 7,834,378 B2 | 11/2010 | Ryu et al. | |
| 2002/0053704 A1* | 5/2002 | Avery et al. | 257/361 |
| 2004/0075146 A1 | 4/2004 | Yu | |
| 2005/0212051 A1* | 9/2005 | Jozwiak et al. | 257/355 |
| 2005/0237139 A1* | 10/2005 | Marioni | 335/220 |
| 2007/0020867 A1 | 1/2007 | Ieong et al. | |
| 2009/0017586 A1 | 1/2009 | Fang et al. | |
| 2009/0108289 A1 | 4/2009 | Abou-Khalil et al. | |
| 2013/0057991 A1* | 3/2013 | Chatty et al. | 361/56 |

FOREIGN PATENT DOCUMENTS

JP    2009021515 A    1/2009

OTHER PUBLICATIONS

International Searching Authority, Search Report and Written Opinion issued in related International application No. PCT/US12/40372 dated Sep. 4, 2012.

* cited by examiner

*Primary Examiner* — Michael Lebentritt
(74) *Attorney, Agent, or Firm* — Wood, Herron & Evans LLP; Anthony J. Canale (57) ABSTRACT

Device structures, fabrication methods, operating methods, and design structures for a silicon controlled rectifier. The method includes applying a mechanical stress to a region of a silicon controlled rectifier (SCR) at a level sufficient to modulate a trigger current of the SCR. The device and design structures include a SCR with an anode, a cathode, a first region, and a second region of opposite conductivity type to the first region. The first and second regions of the SCR are disposed in a current-carrying path between the anode and cathode of the SCR. A layer is positioned on a top surface of a semiconductor substrate relative to the first region and configured to cause a mechanical stress in the first region of the SCR at a level sufficient to modulate a trigger current of the SCR.

16 Claims, 3 Drawing Sheets

SILICON CONTROLLED RECTIFIER WITH STRESS-ENHANCED ADJUSTABLE TRIGGER VOLTAGE

BACKGROUND

The invention relates generally to semiconductor device fabrication and, in particular, to device structures and design structures for a silicon controlled rectifier, as well as methods for fabricating and operating a silicon controlled rectifier.

Complementary metal-oxide-semiconductor (CMOS) technologies integrate p-channel and n-channel field-effect transistors to form an integrated circuit on a single semiconductor substrate. Latch-up, which is precipitated by unwanted transistor action of parasitic bipolar transistors inherently present in bulk CMOS devices, may be a significant issue for bulk CMOS technologies. The unwanted parasitic transistor action, which has various triggers, may cause failure of bulk CMOS devices.

Chips with CMOS devices may be also exposed to electrostatic discharge (ESD) events leading to potentially large and damaging currents within the integrated circuit. Increasing integration densities and performance demands have resulted in reduced device dimensions, which has increased the susceptibility of integrated circuits to ESD events. Manufacturers, assemblers, and users of integrated circuits must take precautions to avoid unintentionally causing ESD events. For example, ESD prevention can be incorporated into the integrated circuit and may include special design techniques for I/O pins and pads, as well as supply pads, to prevent damage to the chip during handling between the time that the chip is manufactured until the time that the chip is installed on a circuit board and while the chip is installed on the circuit board. In the absence of an ESD event, the ESD protection device is in a non-conductive state and is electrically isolated from the protected integrated circuit. If an ESD event is detected, the protection device changes to a conductive state to direct the current of an ESD event to ground and away from the sensitive internal circuits of the chip. The conductive state is maintained until the voltage is discharged to a safe level.

Conventional bulk CMOS devices are susceptible to latch-up. For example, a typical CMOS inverter fabricated using a p-type substrate includes opposite conductivity n- and p-wells that adjoin across a well junction. A p-channel field-effect transistor (pFET) may be fabricated using the n-well and, similarly, an n-channel transistor (nFET) may be fabricated using the p-well. The pFET inherently includes a parasitic p-n-p bipolar junction transistor (BJT) formed by a p-type diffusion, the n-well in which the p-type diffusion is housed, and the p-type substrate. The nFET inherently includes a parasitic n-p-n BJT formed by an n-type diffusion, the p-type substrate, and the n-well housing the corresponding pFET device. The proximity of the nFET to the n-well facilitates the interaction of the BJTs to create a cross-coupled structure. The collector node (i.e., p-type substrate) of the p-n-p BJT serves as the base of the n-p-n BJT, while the collector (i.e., the n-well diffusion) of the n-p-n BJT serves as the base of the p-n-p BJT. The forward-biasing of one parasitic transistor can lead to the forward-biasing of the other parasitic transistor and, if certain conditions are satisfied, latch-up can occur where the p-n junctions of the inverter becomes freely conducting.

A silicon controlled rectifier (SCR) can be constructed with planned wiring of a pFET and an nFET. An SCR, which offer both low capacitance and high failure currents, is a type of ESD device that may be constructed in CMOS technologies to provide ESD protection in CMOS applications that include inverters or other logic gates. SCR devices used for ESD protection are characterized by a trigger voltage/current and a holding voltage/current that determine the device response and effectiveness during an ESD event.

Improved device structures, fabrication and operating methods, and design structures are needed for a silicon controlled rectifier.

BRIEF SUMMARY

In an embodiment of the invention, a method is provided for modulating a trigger current of a silicon controlled rectifier. The method includes applying a mechanical stress to a region of the silicon controlled rectifier at a level sufficient to modulate the trigger current of the silicon controlled rectifier.

In an embodiment of the invention, a method is provided for forming a device structure including a silicon controlled rectifier. The method comprises forming a layer at a location on a top surface of a semiconductor substrate relative to a region of the silicon controlled rectifier and configured so that the layer causes a mechanical stress in the region of the silicon controlled rectifier at a level sufficient to modulate a trigger current of the SCR.

In an embodiment of the invention, a device structure includes a silicon controlled rectifier with an anode, a cathode, a first region in a semiconductor substrate and having a first conductivity type, and a second region in the semiconductor substrate and having a second conductivity type opposite to the first conductivity type. The first and second regions of the silicon controlled rectifier are disposed in a current-carrying path between the anode and cathode of the silicon controlled rectifier. The device structure includes a layer on a top surface of a semiconductor substrate. The layer is located at a position on the top surface of the semiconductor substrate relative to the first region of the silicon controlled rectifier and configured to cause a mechanical stress in the first region of the silicon controlled rectifier at a level sufficient to modulate a trigger current of the silicon controlled rectifier.

In an embodiment of the invention, a design structure is provided that is readable by a machine used in design, manufacture, or simulation of an integrated circuit. The design structure includes a silicon controlled rectifier with an anode, a cathode, a first region in a semiconductor substrate, and a second region in the semiconductor substrate and having an opposite conductivity type to the first region. The first and second regions of the silicon controlled rectifier are disposed in a current-carrying path between the anode and the cathode of the silicon controlled rectifier. The design structure further includes a layer on a top surface of the semiconductor substrate. The layer is configured to cause a mechanical stress in the first region of the silicon controlled rectifier at a level sufficient to modulate a trigger current of the silicon controlled rectifier. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Embodiments of the present invention relate to a stress-engineered silicon controlled rectifier (SCR) that includes a stress structure configured to control and/or modify a triggering voltage or current of the SCR. The stress structures may be a stress layer formed on a surface of the substrate. The stress caused by the stress layer in the SCR may be tensile stress resulting in a trigger voltage/current lower than the nominal trigger voltage/current in the absence of the tensile stress. The stress applied by the stress layer may be compressive stress resulting in a trigger voltage/current higher than the nominal trigger voltage/current in the absence of the compressive stress. The turn-on voltage of the SCR can be increased for latchup prevention or, alternatively, the turn-on voltage of the SCR can be decreased for use as an ESD protection device without having to incur costs for specialized features, such as photomasks for smaller/larger well tap spacing contacts.

Figure 1:
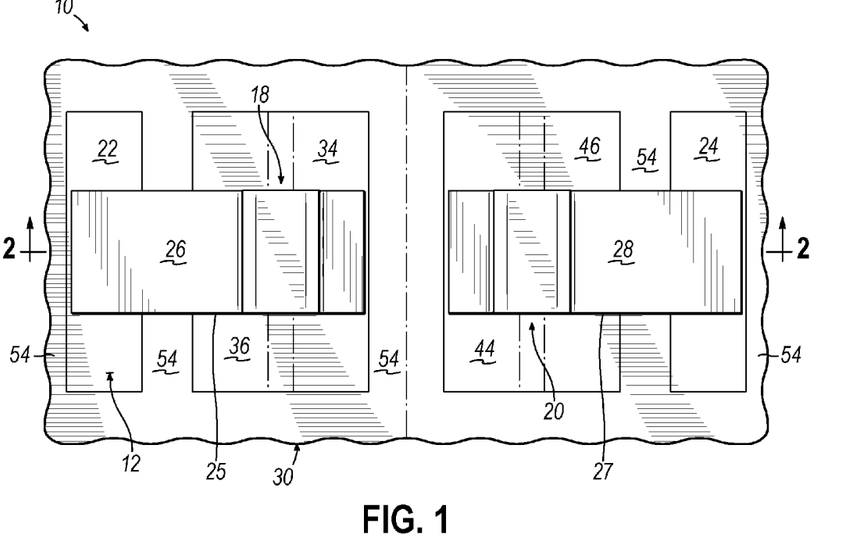
FIG. 1 is a diagrammatic top view of a device structure in accordance with an embodiment of the invention.
Figure 2:
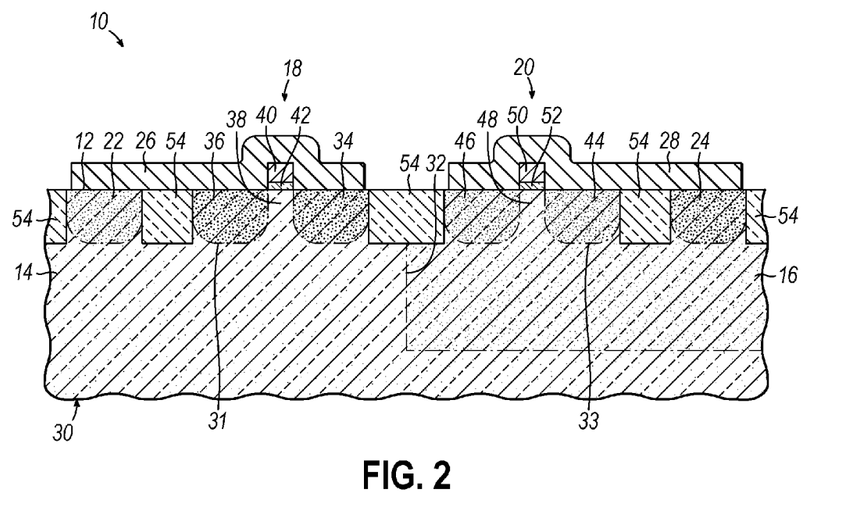
FIG. 2 is a diagrammatic cross-sectional view taken generally along line 2-2 in FIG. 1.
Figure 3:
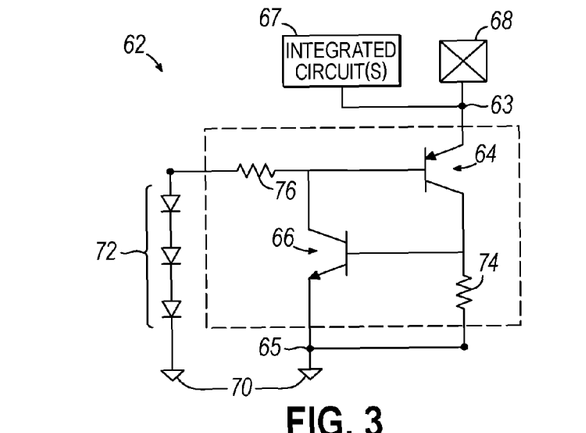
FIG. 3 is a schematic view of the electrical configuration of the device structure of FIGS. 1 and 2.

With reference to FIGS. 1-3 in which like reference numerals refer to like features and in accordance with an embodiment of the invention, a device structure 10 includes a p-well 14, an n-well 16 formed in the p-well 14, an n-channel field-effect transistor (nFET) 18 formed using the p-well 14, a p-channel field-effect transistor (pFET) 20 formed using the n-well 16, a p-well contact region 22 providing an electrical contact to p-well 14, an n-well contact region 24 providing an electrical contact to n-well 16, a first stress layer 26 associated with the nFET 18 and p-well 14, and a second stress layer 28 associated with the pFET 20 and n-well 16. The device structure 10 is formed using a substrate 30, which may be any suitable substrate containing a semiconductor material that a person having ordinary skill in the art would recognize as suitable for the fabrication of an integrated circuit. For example, the substrate 30 may be a device layer of a semiconductor-on-insulator (SOI) substrate or a bulk substrate comprised of semiconductor material. The semiconductor material constituting substrate 30 may be lightly doped with an impurity to alter its electrical properties. For example, the substrate 30 may be a bulk silicon substrate that is lightly doped with a p-type impurity species, such as boron, to render it initially p-type (i.e., p⁻ silicon).

The p-well 14 and n-well 16 are formed as doped regions in the substrate 30. The p-well 14 is laterally positioned in the substrate 30 adjacent to the n-well 16 and adjoins the n-well 16 to shares a coextensive vertical boundary with the n-well 16 that forms a p-n junction 32. The contact regions 22, 24 may intersect a top surface 12 of the substrate 30 and may have the same respective conductivity types as their respective wells 14, 16, but contain higher dopant concentrations than their respective wells 14, 16. The wells 14, 16 do not intersect top surface 12 of the substrate 30 but are instead buried beneath the top surface 12.

The nFET 18 includes a source 34, a drain 36, a channel 38 laterally between the drain 36 and the source 34, and a gate 40 generally overlying the channel 38. The source 34 and drain 36 of the nFET 18 are heavily-doped regions within the p-well 14 and having a p-type conductivity type opposite to that of the p-well 14. The channel 38 is comprised of a region of the p-well 14 and, therefore, has a conductivity type that is opposite to the conductivity type of the source 34 and drain 36. The source 34 and drain 36 of nFET 18 may be formed in the p-well 14 by n-type semiconductor regions which laterally diffuse under each side of the gate 40. A gate dielectric layer 42 electrically isolates the gate 40 from the channel 38. The channel 38 may couple the source 34 and drain 36 for carrier flow when a suitable control voltage is applied to the gate 40.

The pFET 20 includes a source 44, a drain 46, a channel 48 between the source 44 and drain 46, and a gate 50 generally overlying the channel 48. The source 44 and drain 46 of the pFET 20 are heavily-doped regions within the n-well 16 and having an n-type conductivity type opposite to that of the n-well 16. The channel 48 is comprised of a region of the n-well 16 and, therefore, has a conductivity type that is opposite to the conductivity type of the source 44 and drain 46. The source 44 and drain 46 of pFET 20 may be formed in the n-well 16 by p-type semiconductor regions which laterally diffuse under each side of the gate 50. A gate dielectric layer 52 electrically isolates the gate 50 from the channel 48. The channel 48 may couple the source 44 and drain 46 for carrier flow when a suitable control voltage is applied to the gate 50.

Trench isolation regions 54 are formed by a conventional process in the substrate 30. In one embodiment, the trench isolation regions 54 may be formed by a shallow trench isolation (STI) technique that relies on a lithography and dry etching process to define trenches in substrate 30, fills the trenches with dielectric, and planarizes the layer to the top surface 12 of the substrate 30 using a chemical mechanical polishing (CMP) process. The dielectric may be an oxide of silicon, such as densified tetraethylorthosilicate (TEOS) deposited by chemical vapor deposition (CVD) or a high-density plasma (HDP) oxide deposited with plasma assistance. The trench isolation regions 54 electrically isolate the p-well contact region 22, the n-well contact region 24, the source 34 and drain 36 of nFET 18, and the source 44 and drain 46 of pFET 20 from each other.

The nFET 18, pFET 20, and contact regions 22, 24 may be fabricated as part of a CMOS or BiCMOS chip. As understood by a person having ordinary skill in the art of semiconductor fabrication, standard CMOS or BiCMOS fabrication processes may be employed using substrate 30. For example, the p-well 14, n-well 16, and contact regions 22, 24 may be formed by masking, implanting suitable impurity species with suitable kinetic energies, and electrically activating the implanted impurity species with a thermal anneal. The source 34 and drain 36 for nFET 18 may be formed by implanting an impurity species such as phosphorus (P), arsenic (As), antimony (Sb), or other suitable n-type dopant. The source 44 and drain 46 for pFET 20 may be implanted with an impurity species such as boron (B), aluminum (Al), gallium (Ga), or any other suitable p-type dopant. The impurity species may be introduced by ion implantation using the respective gates 40, 50 as a self-aligning block mask and separate resist masks during n-type and p-type dopant implantations. Additional angled implantations may be preformed to add halo regions of opposite conductivity type to the source 34 and drain 36 of nFET 18 or to the source 44 and drain 46 of pFET 20 and to add shallow source/drain extensions of the same conductivity type as the source 34 and drain 36 of nFET 18 or as the source 44 and drain 46 of pFET 20. The halo regions and the shallow source/drain extensions are utilized to control source-to-drain leakage off-currents and on-currents for the nFET 18 and pFET 20. The implanted impurity species may be electrically activated by a thermal anneal.

The gate 40 and gate dielectric layer 42 of the nFET 18 and the gate 50 and gate dielectric layer 52 of the pFET 20 may be formed by depositing a layer stack that includes one or more insulator layers and one or more conductive layers. Photolithography and RIE may then be used to define the gates 40, 50 from the layer stack. The one or more layers of the gates 40, 50 may be comprised of doped polycrystalline silicon (polysilicon) and/or a metal. In various embodiments, the metal may be selected from tungsten (W), tantalum (Ta), titanium nitride (TiN), zirconium nitride (ZrN), hafnium nitride (HfN), vanadium nitride (VN), niobium nitride (NbN), tantalum nitride (TaN), tungsten nitride (WN), titanium aluminum nitride (TiAlN), tantalum carbide (TaC), tantalum magnesium carbide (TaMgC), tantalum carbonitride (TaCN), a combination or an alloy thereof, or analogous materials recognized by a person having ordinary skill in the art. The constituent materials of gates 40, 50 may be deposited by CVD, ALD, physical vapor deposition (PVD), etc. Sidewall spacers (not shown) comprised of a dielectric material, such as $Si_3N_4$, may be formed on the sidewalls of each of the gates 40, 50 by a conventional spacer formation process.

The one or more layers of the gate dielectric layers 42, 52 may be comprised of an insulating material (e.g., a non-conductor) with a dielectric constant (e.g., a permittivity) characteristic of a high-k dielectric. As used herein, candidate high-k dielectrics for the gate dielectric layers 42, 52 are considered to have a dielectric constant greater than 10 and, preferably, in a range of 10 to 100. Air, which is an accepted reference point for values of relative permittivity or dielectric constant, has a dielectric constant of approximately unity. Representative dielectric materials for the gate dielectric layer include, but are not limited to, hafnium-based dielectric materials like hafnium oxide ($HfO_2$), hafnium silicate (HfSiO), or a nitrided hafnium silicate (HfSiON), aluminum oxide ($Al_2O_3$), lanthanum oxide ($La_2O_3$), titanium dioxide ($TiO_2$), tantalum oxide ($Ta_2O_5$), zirconium oxide ($ZrO_2$), zirconium silicon oxide (ZrSiO), yttrium oxide ($Y_2O_3$), strontium oxide (SrO), or strontium titanium oxide (SrTiO), mixtures thereof, or layered stacks of these and other dielectric materials. These types of high-k dielectric materials may be deposited by atomic layer deposition (ALD), chemical vapor deposition (CVD), or another conventional deposition technique. Use of a high-k dielectric in a transistor gate structure has been observed to significantly reduce leakage currents, which reduces power consumption for a field-effect transistor.

Standard back-end-of-line (BEOL) processing may follow the formation of the device structure 10 to form a BEOL interconnect structure. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process may be replicated to stack multiple wiring levels so that a multi-level framework of conductive interconnections is formed. Damascene processes and the materials used in damascene processes are comprehended by a person having ordinary skill in the art.

The metallization of the BEOL interconnect structure may define various wiring paths, including a wiring path coupling an input/output (I/O) pad 68 with the source 44 of the pFET 20 and a wiring path coupling the source 34 of the nFET with a ground pad 70 that is electrically coupled to a ground connection, GND, during device operation. The I/O pad 68 is further coupled with functional devices of an integrated circuit 67 on the chip. The metallization of the BEOL interconnect structure may also include a wiring path from the p-well 14 through the p-well contact region 22 to a diode string 72 that includes a plurality of serially-coupled diodes and that is connected to the ground connection, GND. In an alternative embodiment, the diode string 72 may be replaced a string of diode-connected transistors.

As best shown in FIG. 3 and in the representative embodiment, the source 34 of nFET 18, the p-well 14, the n-well 16, and the source 44 of pFET 20 in the device structure 10 define an SCR 62 as a four-layer structure doped to exhibit alternating conductivity types, specifically n-type conductivity and p-type conductivity, and that includes three p-n junctions. One of the junctions of the SCR 62 is defined by p-n junction 32. Another junction 31 of the SCR 62 is defined along a coextensive horizontal boundary between the source 34 of nFET 18 and the p-well 14. Yet another junction 33 of the SCR 62 is defined along a coextensive horizontal boundary between the n-well 16 and the drain 46 of pFET 20. Junction 32 is oriented transverse to junctions 31, 33 because of the arrangement of the source 34 of nFET 18, the p-well 14, the n-well 16, and the source 44 of pFET 20. In the representative embodiment, junction 32 is horizontally oriented relative to the top surface 12 of the substrate 30 and junctions 31, 33 are vertically oriented relative to the top surface 12 of the substrate 30.

The SCR 62, which is an NPNP layered structure in the representative embodiment, includes a parasitic PNP bipolar transistor 64 and a parasitic NPN bipolar transistor 66 that is cross-coupled with the PNP bipolar transistor 64. The PNP bipolar transistor 64 is defined by the p-well 14, and the n-well 16, and the source 44 of pFET 20. A collector region of PNP bipolar transistor 64 and a base region of NPN bipolar transistor 66 are collectively represented by the p-well 14. The NPN bipolar transistor 66 is defined by the source 34 of nFET 18, the p-well 14, and the n-well 16. The source 34 of nFET 18 operates as the emitter of the NPN bipolar transistor 66 and serves as the cathode 65 of the SCR 62. A base region of PNP bipolar transistor 64 and a collector region of NPN bipolar transistor 66 are collectively represented by the n-well 16. The source 44 of pFET 20 operates as the emitter of PNP bipolar transistor 64 and serves as the anode 63 of the SCR 62.

The SCR 62 may be used to provide ESD protection, as best shown in FIG. 3, to the devices of one or more integrated circuits on the chip. To that end, the SCR 62 and integrated circuit(s) 67 of the chip are electrically coupled by a shared signal path to the I/O pad 68. More specifically, the source 44 of pFET 20 (i.e., the anode 63 of the SCR 62) is coupled with the I/O pad 68 and the source 34 of NFET 18 (i.e., the cathode 65 of the SCR 62) is coupled to the ground pad 70, which is grounded when the chip is not powered. The SCR 62 may provide a low-impedance current-carrying path from the I/O pad 68 to the ground pad 70 for the current of an ESD event and, thereby, diverts the current of the ESD event from reaching and damaging the integrated circuit(s) 67 on the chip. The current from the ESD event is directed through the current-carrying path that includes multiple regions of the SCR 62, namely the source 34 of nFET 18, the p-well 14, the n-well 16, and the source 44 of pFET 20.

In the representative embodiment, the SCR 62 is triggered to discharge the ESD current from a positive mode ESD event at the I/O pad 68 to the ground buss (GND) at a ground pad 70. During the positive mode ESD event, the PNP bipolar transistor 64 turns on and the collector current of the PNP bipolar transistor 64 raises the potential of substrate 30. In response to the potential of substrate 30 reaching approximately 0.7 volts, the NPN bipolar transistor 66 turns on. If the product of the current gains for the bipolar transistors 64, 66 exceeds unity, then the turn-on condition is sustained so that the SCR 62 is latched in the low impedance state and directs the ESD current from the I/O pad 68 through the SCR 62 to the ground buss at ground pad 70. When the chip is in a powered condition during normal operation, the SCR 62 will present a high impedance between the I/O pad 68 and the ground buss at ground pad 70 so that signals communicated over the signal path between the I/O pad 68 and integrated circuit 67 may be relatively unaffected by the presence of the SCR 62.

The p-well 14 is characterized by an electrical resistance 74 and, similarly, the n-well 16 is characterized by an electrical resistance 76. The electrical resistance 76 of the n-well 16 is coupled in series with the diode string 72 to provide a voltage trigger network characterized by a triggering voltage and a triggering current for the SCR 62 to enter the low impedance state. The triggering current and triggering voltage for the SCR 62 can be modulated by varying the magnitude of the electrical resistance 76 of the n-well 16.

In an alternative embodiment, the location of the diode string 72 may be moved so that the diode string 72 is coupled in series with electrical resistance 74 of the p-well 14. This triggering configuration is capable of discharging the current of a positive mode ESD event. As discussed above, the triggering voltage and current for the SCR 62 with this triggering configuration can be modulated by varying the magnitude of the electrical resistance 74 of the p-well 14.

In an alternative embodiment, the nFET 18 and pFET 20 may be replaced by respective diode structures that collectively define the SCR 62. Specifically, the drain 36 and gate structure of the nFET 18 and the drain 46 and gate structure of the pFET 20 may be omitted from the device construction.

The first stress layer 26 associated with the nFET 18 and the second stress layer 28 associated with the pFET 20 may each be formed with either internal compressive stress or internal tensile stress. In one embodiment, the first stress layer 26 may be under tensile stress, which is transferred to the p-well 14 and causes compressive stress in the semiconductor material comprising the p-well 14. Alternatively, the first stress layer 26 may be under compressive stress, which is transferred to the p-well 14 and causes tensile stress in the semiconductor material comprising the p-well 14. In one embodiment, the second stress layer 28 may be under tensile stress, which is transferred to the p-well 14 and causes compressive stress in the semiconductor material comprising the p-well 14. Alternatively, the second stress layer 28 may be under compressive stress, which is transferred to the p-well 14 and causes tensile stress in the semiconductor material comprising the p-well 14. Stress is a measurement of the average internal force per unit area of a surface within the body of semiconductor material constituting the n-well 16 or the body of semiconductor material constituting the p-well 14 as respective reactions to external forces received from the stress layers 26, 28.

In one embodiment, the stress layers 26, 28 of device structure 10 may each be comprised of a layer of a dielectric material that is non-conductive and electrically insulating. The dielectric material in each layer may be under either internal compressive stress or internal tensile stress. The stress layers 26, 28 may be characterized by an opposite polarity (i.e., an opposite stress type selected from tensile stress or compressive stress). The magnitude of the tensile stress may range from 600 MPa (Mega-pascals) to 1500 MPa and the magnitude of the compressive stress may range from −600 MPa to −1500 MPa.

In a representative embodiment, the dielectric material in the stress layers 26, 28 may be comprised of silicon nitride ($Si_3N_4$) or non-stoichiometric silicon nitride ($Si_xN_y$) that is deposited by a CVD process, such as plasma-enhanced CVD. Deposition conditions, such as substrate temperature, plasma power, and gas flow rates, for the CVD process are controlled to alter the reaction rate within the deposition chamber and to thereby allow control to be exerted over the stress state of the deposited dielectric layer. The stress state of the stressed dielectric layer can be controlled by changing the deposition conditions. Specifically, the deposition conditions may be adjusted to incorporate a targeted amount of either compressive stress or tensile stress into the stress layers 26, 28. The stress layers 26, 28 may each have a physical thickness between 20 nanometers to 50 nanometers.

The stress layers 26, 28 of device structure 10 may be sequentially formed by a fabrication process using deposition, photolithography, and etching. Specifically, the first stress layer 26 may be deposited as a blanket layer over the entire surface area of the semiconductor device. The blanket layer may be conformal with a thickness that is independent of the topology of underlying features. In one embodiment, the deposition conditions may be selected such that the first stress layer 26 is under compressive stress, which imparts a tensile stress to the p-well 14. The first stress layer 26 is then partially removed, such as by masking and etching, from at least those areas on the substrate 30 that do receive a benefit from the imparted tensile stress and that may receive a benefit from the second stress layer 28, such as over the n-well 16. A thin etch stop layer beneath the first stress layer 26 or a timed etch may be used to protect underlying structures when the first stress layer 26 is partially removed.

After the first stress layer 26 is deposited, a resist layer comprised of a radiation-sensitive organic material is applied by spin coating, pre-baked, exposed to radiation to impart a latent image of a pattern that retains the stress layer 26 over the intended surface area correlated with the p-well 14, baked, and then developed with a chemical developer. A dry etching process, such as reactive ion etching (RIE), may be used to remove portions of the first stress layer 26 from surface areas unmasked by the resist layer. After patterning, the first stress layer 26 is bound by an outer perimeter 25 characterized by a length and width. In the representative embodiment, the outer perimeter 25 of the first stress layer 26 is inscribed inside an outer perimeter of the p-well 14 and is separated from the p-well 14 by the source 34, drain 36, channel 38, gate 40, and gate dielectric layer 42 of the nFET 18 so that the stress transfer is indirect. The resist layer is subsequently removed by oxygen plasma ashing or wet chemical stripping. Procedures for applying and lithographically patterning the resist layer using a photomask and lithography tool are known to a person having ordinary skill in the art.

In a subsequent fabrication stage of the process flow, the second stress layer 28 may be deposited as a blanket layer over the entire surface area of the semiconductor device. The blanket layer may be conformal with a thickness that is independent of the topology of underlying features. The deposition conditions for the blanket layer are selected so that the stress is of the opposite polarity to the stress incorporated the first stress layer 26. In one embodiment, the deposition conditions may be selected such that the second stress layer 28 is under tensile stress, which imparts a compressive stress to the n-well 16. The second stress layer 28 is then partially removed, such as by masking and etching, from at least those areas on the substrate 30 that do receive a benefit from the imparted compressive stress and that may receive a benefit from the first stress layer 26, such as over the p-well 14. A thin etch stop layer beneath the second stress layer 28 or a timed etch may be used to protect underlying structures when the second stress layer 28 is partially removed. The first stress layer 26 may be thereby masked during the process forming the second stress layer 28.

After the second stress layer 28 is deposited, a resist layer comprised of a radiation-sensitive organic material is applied by spin coating, pre-baked, exposed to radiation to impart a latent image of a pattern that retains the stress layer 28 over the intended surface area correlated with the n-well 16, baked, and then developed with a chemical developer. A dry etching process, such as RIE, may be used to remove portions of the second stress layer 28 from surface areas unmasked by the resist layer. After patterning, the second stress layer 28 is bound by an outer perimeter 27 characterized by a length and width. In the representative embodiment, the outer perimeter 27 of the second stress layer 28 is inscribed inside an outer perimeter of the n-well 16 and is separated from the n-well 16 by the source 44, drain 46, channel 48, gate 50, and gate dielectric layer 52 of the pFET 20 so that the stress transfer is indirect. The resist layer is subsequently removed by oxygen plasma ashing or wet chemical stripping.

The order of forming the stress layers 26, 28 can be interchanged so that stress layer 28 is formed before stress layer 26. Generally, a compressive stress layer may be formed before or after a tensile stress layer or in the converse order. In an alternative embodiment, one of the stress layers 26, 28 may be omitted from the device structure such that mechanical stress is only transferred to the p-well 14 or such that mechanical stress is only transferred to the n-well 16. If both stress layers 26, 28 are present in device structure 10, the stress layers 26, 28 are non-overlapping and spaced so that stress layer 26 applies mechanical stress primarily to the p-well 14 and stress layer 28 applies mechanical stress primarily to the n-well 16. Preferably, stress layer 26 applies negligible mechanical stress to the n-well 16 and stress layer 28 applies negligible mechanical stress to the p-well 14.

The mechanical stress respectively caused by the stress layers 26, 28 in the p-well 14 and n-well 16 affects carrier mobility. The carrier mobility in the p-well 14 and the carrier mobility in the n-well 16 respond differently to different types of mechanical stress. The sheet resistance of the p-well 14 and n-well 16 inversely tracks the change in carrier mobility. For example, carrier mobility in the p-well 14 may be increased by compressive stress caused by stress layer 26, which lowers the electrical resistance 74. As another example, carrier mobility in the p-well 14 may be decreased by tensile stress caused by stress layer 26, which raises the electrical resistance 74. As yet another example, carrier mobility in the n-well 16 may be increased by tensile stress caused by stress layer 28, which lowers the electrical resistance 76. As still another example, carrier mobility in the n-well 16 may be decreased by compressive stress caused by stress layer 28, which raises the electrical resistance 76.

Strain engineering can be employed to enhance the device performance of the SCR 62 by adjusting the value of the electrical resistance 74 of the p-well 14 though selection of the mechanical stress in the p-well 14 caused by the stress layer 26 and/or by adjusting the value of the electrical resistance 76 of the n-well 16 though selection of the mechanical stress in the n-well 16 caused by the stress layer 28. The electrical resistance 74 of the p-well 14 may be raised or lowered relative to a condition in which mechanical stress is absent in the p-well 14. The electrical resistance 76 of the n-well 16 may be raised or lowered relative to a condition in which mechanical stress is absent in the n-well 16.

These adjustments to the electrical resistances 74, 76, which can be made with alone or in combination, can be used to select the triggering voltage and/or the triggering current for the SCR 62. In particular, the device structure 10 may include either or both of the stress layers 26, 28. For example, the device structure 10 may only include stress layer 26 and may omit stress layer 28. As a result of the ability to independently include the stress layers 26, 28, one or both of the electrical resistances 74, 76 can be altered to select electrical properties of the SCR 62, such as the triggering voltage and triggering current for the SCR 62.

Figure 4:
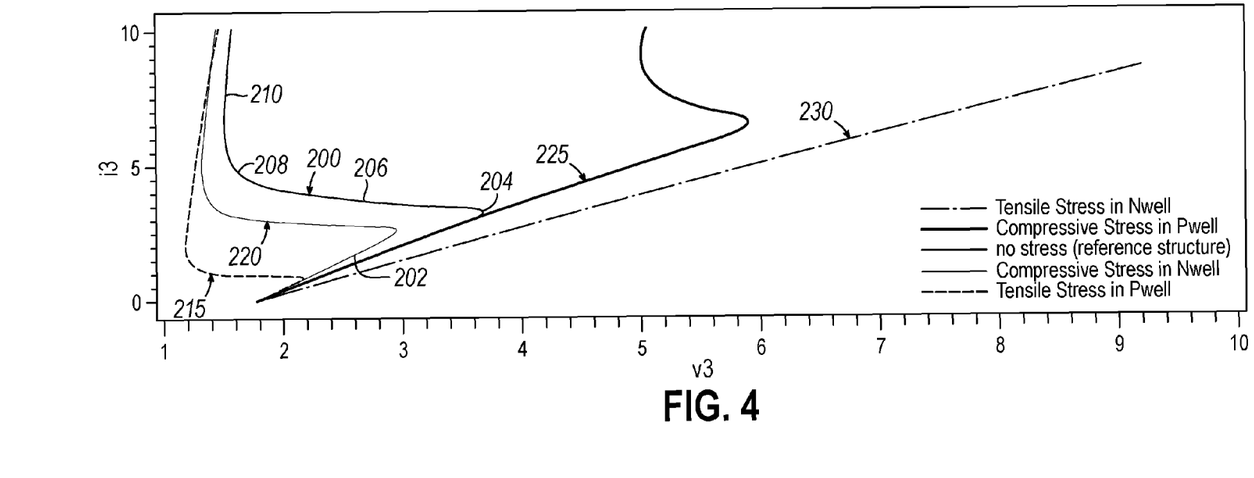
FIG. 4 is a graph showing the dependence of the trigger current of the SCR ESD structure shown in FIGS. 1-3 in which stress boxes were created in Technology Computer Aided Design (TCAD) to evaluate impacts of various locations and stress polarities (i.e., compressive and/or tensile).

With reference to FIG. 4, the performance of the SCR 62 was simulated from Technology Computer Aided Design (TCAD) simulations for different types of mechanical stresses in the p-well 14 and the n-well 16 of the diode version of device structure 10. The result of the simulation is shown as is shown as a series of curves of device current as a function of device voltage. Each curve was generated by a TCAD simulation with different conditions input to the simulation for stress boxes representing the mechanical stress. The amount of mechanical stress present in the p-well 14 or to n-well 16 under each specific condition was approximately 1 GPa, and the polarity of the mechanical stress was either selected as either tensile or compressive. Technology Computer-Aided Design (TCAD) refers to the use of numerical computer simulations to develop and optimize semiconductor processing technologies and devices. TCAD simulations may be used to analyze the electrical characteristics of a device based on a physical model of the device. The methodology and applicability of TCAD simulations, as well as device models, are familiar to a person having ordinary skill in the art.

Curve 200 reflects the behavior of the SCR 62 in the absence of stress layers 26, 28 and, therefore, in the absence of mechanical stress. During an ESD event, the SCR 62 is placed in a low impedance state by the operation of the diode string 72 so that the current from the ESD event is directed in the current-carrying path through the SCR 62 to the ground pad 70. As the applied voltage bias across the SCR 62 increases along a portion 202 of the current-voltage curve, the current flowing from the cathode 65 of the SCR 62 to the anode 63 of the SCR 62 monotonically increases with increasing voltage.

At a trigger current 204 in the current-voltage curve, a voltage snapback 206 occurs in which the voltage across the SCR 62 decreases instantaneously, while the current remains approximately constant. A holding current 208 marks the conclusion of the voltage snapback 206 and, thereafter, the SCR 62 follows a current-voltage path 210 in the current-voltage curve. The SCR 62 remains latched until ESD event subsides and the anode-to-cathode current across the SCR 62 drops below the holding current 208.

Curve 215 reflects the influence of tensile stress in the p-well 14 in the absence of mechanical stress applied to the n-well 16. Curve 220 reflects the influence of compressive stress on the n-well 16 in the absence of mechanical stress applied to the p-well 14. Under each set of simulation conditions and in comparison with curve 200 in which mechanical stress is absent from the wells 14, 16, the value of the trigger current for the SCR 62 reflected in each of the current-voltage curves 215, 220 is lowered because the sheet resistance of the respective well is raised. The rise in sheet resistance causes an elevation in the electrical resistance 74 of the p-well 14 and causes an elevation in the electrical resistance 76 of the n-well 16.

In each of the current-voltage curves 215, 220, the mechanical stress applied to the respective well of the SCR 62 is at a level sufficient to modulate a trigger current of the SCR 62. Specifically, the level of mechanical stress is sufficient to reduce the trigger current of the SCR 62. The decrease in the trigger current may be beneficial for optimizing the reaction of the SCR 62 to an ESD event.

Curve 225 reflects the influence of compressive stress in the p-well 14 in the absence of mechanical stress applied to the n-well 16. Curve 230 reflects the influence of tensile stress on the n-well 16 in the absence of mechanical stress applied to the p-well 14. Under each set of simulation conditions and in comparison with curve 200 in which mechanical stress is absent from the wells 14, 16, the value of the trigger current for the SCR 62 is raised because the sheet resistance is lowered. The lowering of the sheet resistance causes a reduction in the electrical resistance 74 of the p-well 14 and causes a reduction in the electrical resistance 76 of the n-well 16.

In each of the curves 225, 230, the mechanical stress applied to the respective region of the SCR 62 is at a level sufficient to modulate a trigger current of the SCR 62. Specifically, the level of mechanical stress is sufficient to increase the trigger current of the SCR 62. The increase in the trigger current may be beneficial for optimizing the resistance of the SCR 62 to latch-up by reducing device susceptibility to latch-up.

Figure 5:
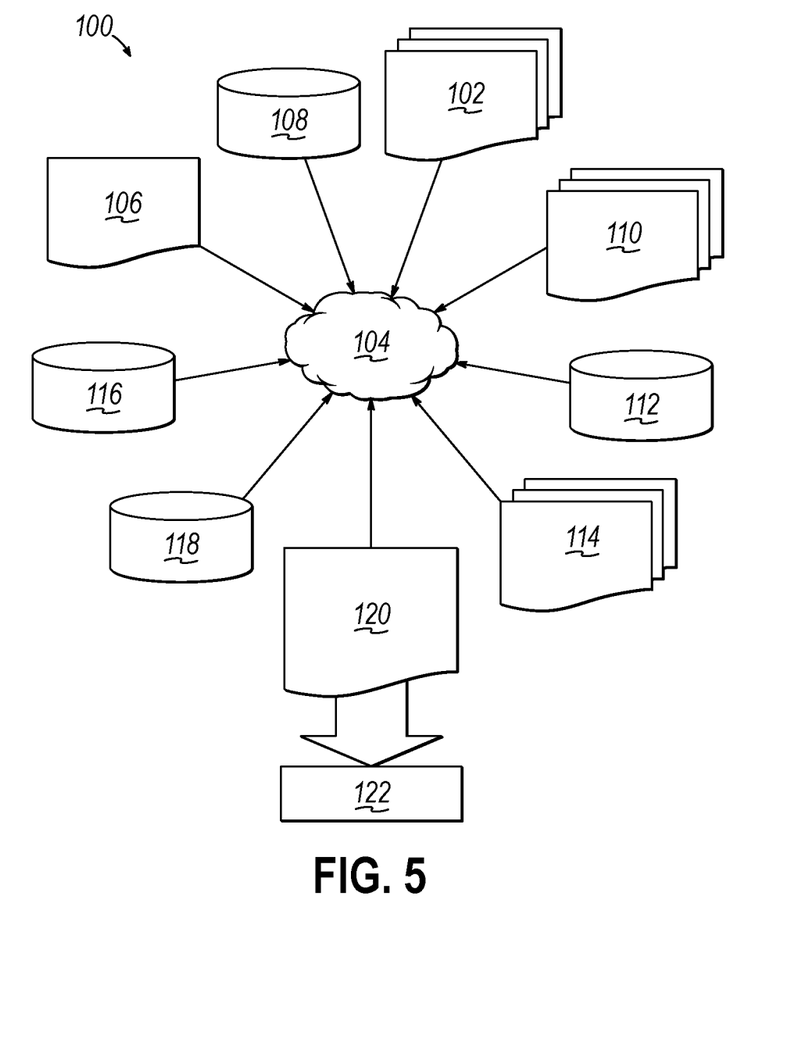
FIG. 5 is a flow diagram of a design process used in semiconductor design, manufacture, and/or test.

FIG. 5 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-4. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-4. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-4 to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 120 may comprise a compiled, executable HDL simulation model that functionally simulates the devices shown in FIGS. 1-4.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for modulating a trigger current of a silicon controlled rectifier (SCR), the method comprising:
    applying a first mechanical stress from a first stress layer to a first well of the SCR at a level sufficient to adjust an electrical resistance of the first well that is in series with a trigger diode string of a trigger network and thereby modulate the trigger current of the SCR to be equal to a selected value,
    wherein the first stress layer is comprised of a dielectric material deposited with deposition conditions selected to impart a stress state that transfers the first mechanical stress from the first stress layer to the first well at a level sufficient to adjust the electrical resistance.

2. The method of claim 1 wherein applying the first mechanical stress from the first stress layer to the first well of the SCR comprises:
    reducing the trigger current of the SCR in response to the first mechanical stress.

3. The method of claim 1 wherein applying the first mechanical stress from the first stress layer to the first well of the SCR comprises:
    increasing the trigger current of the SCR in response to the first mechanical stress.

4. The method of claim 1 wherein the semiconductor substrate has a top surface, and the first stress layer is located on the top surface of the semiconductor substrate.

5. The method of claim 1 further comprising:
    applying a second mechanical stress to a second well of the SCR.

6. The method of claim 5 wherein the first mechanical stress and the second mechanical stress have opposite polarities selected from tensile stress or compressive stress.

7. The method of claim 1 wherein the cathode of the SCR is coupled to an input/output pad, and the anode of the SCR is coupled to a ground pad.

8. A method for forming a device structure including a silicon controlled rectifier (SCR) and a trigger network coupled with the SCR, the method comprising:

forming an anode or a cathode of the SCR in a first well of a semiconductor substrate;

coupling a diode string of the trigger network in series with an electrical resistance represented by the first well; and depositing a first stress layer comprised of a dielectric material on a top surface of the semiconductor substrate at a first location relative to the first well and with deposition conditions selected to impart a stress state that transfers a first mechanical stress from the first stress layer to the first well at a level sufficient to adjust the electrical resistance of the first well and thereby modulate a trigger current of the SCR to be equal to a selected value.

9. The method of claim 8 wherein the anode is formed in the first well, and further comprising:

forming the cathode of the SCR in a second well of the semiconductor substrate; and forming a second stress layer on the top surface of the semiconductor substrate at a second location relative to the second well and configured so that the second stress layer causes a second mechanical stress in the second well.

10. The method of claim 9 wherein the first mechanical stress and the second mechanical stress have opposite polarities selected from tensile stress or compressive stress.

11. The method of claim 8 wherein forming the first layer comprised of the dielectric material at the first location on the top surface of the semiconductor substrate comprises:

depositing the first stress layer on the top surface of the semiconductor substrate with deposition conditions that cause internal stress in the first layer; and patterning the first layer to form the first layer at the first location on the top surface of the semiconductor substrate.

12. The method of claim 9 wherein the cathode is formed in the first well, and further comprising:

forming the anode of the SCR in the second well.

13. The method of claim 8 wherein the trigger current of the SCR is reduced in response to the first mechanical stress.

14. The method of claim 8 wherein the trigger current of the SCR is increased in response to the first mechanical stress.

15. The method of claim 8 further comprising:

coupling the cathode of the SCR to an input/output pad; and coupling the anode of the SCR to a ground pad.

16. The method of claim 8 wherein the dielectric material is silicon nitride.

* * * * *